(12) United States Patent
Seah et al.

(10) Patent No.: US 7,880,277 B2
(45) Date of Patent: Feb. 1, 2011

(54) METHOD FOR CONNECTING A DIE ASSEMBLY TO A SUBSTRATE IN AN INTEGRATED CIRCUIT AND A SEMICONDUCTOR DEVICE COMPRISING A DIE ASSEMBLY

(75) Inventors: Alvin Seah, Singapore (SG); Elstan Anthony Fernandez, Singapore (SG)

(73) Assignee: Infineon Technologies AG, Munich (DE)

( * ) Notice: Subject to any disclaimer, the term of this patent is extended or adjusted under 35 U.S.C. 154(b) by 794 days.

(21) Appl. No.: 11/485,194

(22) Filed: Jul. 12, 2006

(65) Prior Publication Data
US 2007/0040251 A1 Feb. 22, 2007

Related U.S. Application Data

(63) Continuation of application No. PCT/SG2004/000011, filed on Jan. 12, 2004.

(51) Int. Cl.
*H01L 23/495* (2006.01)
(52) U.S. Cl. ...................... 257/668; 257/686
(58) Field of Classification Search ................. 257/686, 257/777, 668, 723, 724
See application file for complete search history.

(56) References Cited

U.S. PATENT DOCUMENTS

| | | | |
|---|---|---|---|
| 4,855,867 A | 8/1989 | Gazdik et al. | |
| 5,345,205 A | 9/1994 | Kornrumpf | |
| 5,776,797 A * | 7/1998 | Nicewarner et al. | 438/107 |
| 5,789,815 A | 8/1998 | Tessier et al. | |
| 6,208,521 B1 * | 3/2001 | Nakatsuka | 361/749 |
| 6,841,855 B2 * | 1/2005 | Jaeck et al. | 257/668 |
| 6,977,441 B2 * | 12/2005 | Hashimoto | 257/777 |
| 2003/0069654 A1 | 4/2003 | Larson | |
| 2003/0081392 A1 | 5/2003 | Cady et al. | |

FOREIGN PATENT DOCUMENTS

EP   1 317 001 A1   6/2003
WO   WO 01/91173 A1   11/2001

* cited by examiner

*Primary Examiner*—Sheila V Clark
(74) *Attorney, Agent, or Firm*—Slater & Matsil, L.L.P.

(57) ABSTRACT

A semiconductor device includes a substrate, a die assembly attachable to the substrate and a flexible strip extending over the substrate and the die assembly. The flexible strip has one or more routing circuits carried thereon. The die assembly and the substrate are arranged to be electrically connected through the one or more routing circuits carried on the flexible strip.

9 Claims, 3 Drawing Sheets

METHOD FOR CONNECTING A DIE ASSEMBLY TO A SUBSTRATE IN AN INTEGRATED CIRCUIT AND A SEMICONDUCTOR DEVICE COMPRISING A DIE ASSEMBLY

This application is a continuation of co-pending International Application No. PCT/SG2004/000011, filed Jan. 12, 2004, which designated the United States and was published in English, of which application is incorporated herein by reference.

TECHNICAL FIELD

The present invention relates to a method for connecting a die assembly to a substrate in an integrated circuit and a semiconductor device for use in an integrated circuit.

BACKGROUND

In conventional integrated circuits, particularly memory chips, several dies may be stacked on top of each other in a package to increase the overall capacity of the device. A ball grid array (BGA) structure is typically used for the stacked-die structure device. In such devices, a first semiconductor die is attached to the substrate via an adhesive layer. A wire bonding process is applied to electrically connect the first die to the substrate. A second die is then stacked on the first die with an adhesive layer formed between the first die and the second die. A wire bonding process is then performed to electrically connect the second die to the substrate and/or the first die. A molding compound is then formed over the substrate to encapsulate the substrate, the dies and the wires. Finally, solder balls are attached to the under surface of the substrate to contact the solder pads on the substrate. In pyramid type stacked-die applications, the first die is required to be larger than the second die.

The effectiveness of wire bonding depends on the accuracy control of die placement, selection of wire loops, wire type, capillary type and process parameters governed by the die attachment, wire bond and molding design rules. Such design rules include the control of die placement to within ±50 µm, the highest loop height to within 150 µm±25 µm, a bond line thickness to less than 75 percent of the respective die thickness, a wire angle to within ±50° and a wire sweep to less than 10 mills (254 µm). Poor settings of the process parameters and/or inappropriate wire and capillary selection may lead to a high assembly reject rate with associated problems like wire short circuits, neck ball, failed connections to the pads and/or leads, cratering of the pad and other problems.

Even with a single die device there is a problem in bonding the connections from the dies to the substrate and such problems are increased in multi-stack devices, particularly in wire bond/wire bond mode or flip-chip/wire bond mode. In particular, the molding process can detach the wires or bring them into contact with adjacent wires causing short circuits. Short circuiting may also be caused by wire strays, wire leaning and wire sweep after molding or wire bonding and can affect the performance of the device.

Conventional methods of electrically interconnecting the stacked die to the substrate have a number of defects. In particular, conventional methods may suffer from one or more of the following problems, such as wire shorting due to die placement offset, inappropriate wire and capillary use, wrong parameter settings (wire loops), mishandling of bonded strips, excessive wire sweep after molding, non-stick-on pad due to the wrong parameter setting (USG current), contamination of the bond pad, large probe mark size and wrong bonding.

Furthermore, wire leaning and/or wire sways immediately after wire bonding could affect the performance of molding with the high possibility of wire shorting as a result. In addition, inappropriate loop length and height of the loops, as well as weak interconnect adhesion could all further aggravate the encapsulation process. Also, a capillary touching a wire and a wire touching the die edge could both result in poor bonding performance, which affects the operation of the device.

In view of the foregoing problems with conventional processes and devices, a need exists for a quick and an easily applied method for connecting dies and substrates.

SUMMARY OF THE INVENTION

In general terms, the present invention provides a means of electrically interconnecting one or more dies to each other and/or a substrate through a flexible strip. Preferably, the bond pads of a second die are interconnected to a first die and/or the substrate through the bonding of the flexible strip. The bond pads of the first die may also be connected to the substrate through the bonding of the flexible strip. The flexible strip preferably includes routing circuits applied to an underlying surface thereof with a series of matching solder-on pads being attached to the ends of the routing circuits. The flexible strip is preferably pinned down to the substrate by guided pins on an aluminium clamp template. Bonding of the flexible strip onto the one or more dies (silicon-to-silicon) and the substrate is through the solder-on pads on the flexible strip, bond pads on the one or more dies and bond fingers on the substrate. Bonding is achieved, for example, by application of ultrasonic or heating techniques.

This method replaces conventional wire bonding processes. It is advantageous as it facilitates bonding and more particularly increases the efficiency in chip bonding procedures.

According to a first aspect of the invention, a die assembly can be connected to a substrate in an integrated circuit. The die assembly is attached to the substrate. A flexible strip is located over the substrate and the die assembly. The flexible strip carries one or more conducting routing circuits terminated at each end with a solder-on pad. Electrical contact is established between the die assembly and the substrate through the one or more routing circuits carried on the flexible strip.

According to a second aspect of the invention, a semiconductor device is provided for use in an integrated circuit. This device includes a substrate and a die assembly attachable to the substrate. A flexible strip extends over the substrate and the die assembly, the flexible strip having one or more routing circuits carried thereon. The die assembly and the substrate are arranged to be electrically connected through the one or more routing circuits carried on the flexible strip.

Preferably, the flexible strip is formed of polyimide material and may be in a tape and reel format or a strip format for ease of use.

According to a third aspect of the invention there is provided an integrated circuit comprising one or more devices of the type defined above.

According to a fourth aspect of the invention there is provided an integrated circuit formed according to the method defined above.

One or more embodiments of the present invention offer the advantage of reducing the waste of materials which, in conventional systems and methods, are due to items rejected because of failures in the wire bonding process; for example, the failure of the wires to stick on bond pads and wedges, damaged wires and bonding units where the wires are bonded to the wrong pads and therefore have to be discarded. Further advantages of one or more embodiments of the present invention are a cost saving due to the materials used, a time saving as the bonding is carried out in one step rather than bonding each wire separately, and much less skill is required from the operator when applying the methods embodying the invention than when using conventional processes. Also, the forming of complex wire loops such as the crossing of wires, high/low loops and the different modes of bonding does not occur due to the presence of the flexible strip.

BRIEF DESCRIPTION OF THE DRAWINGS

The present invention will now be described by way of example only and with reference to the following drawings in which.

DETAILED DESCRIPTION OF ILLUSTRATIVE EMBODIMENTS

Figure 1:
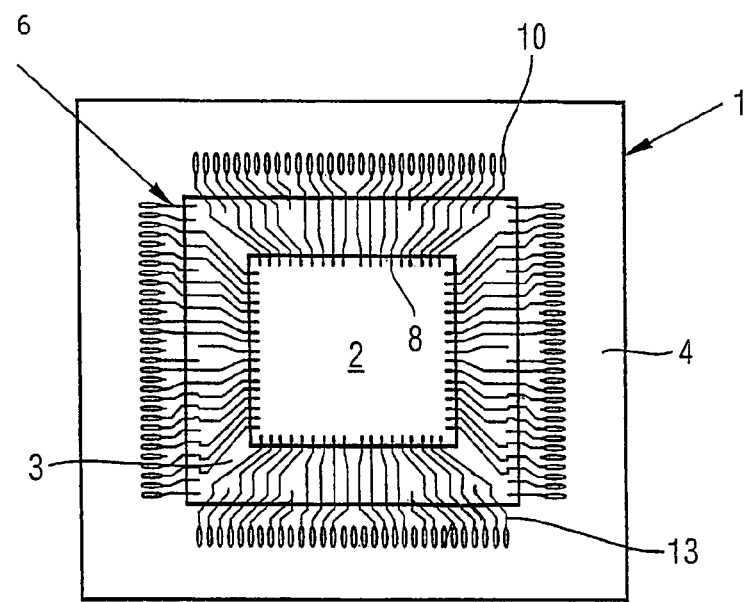
FIG. 1 is a plan view of a stack of dies mounted on a substrate according to an embodiment of the present invention.
Figure 2:
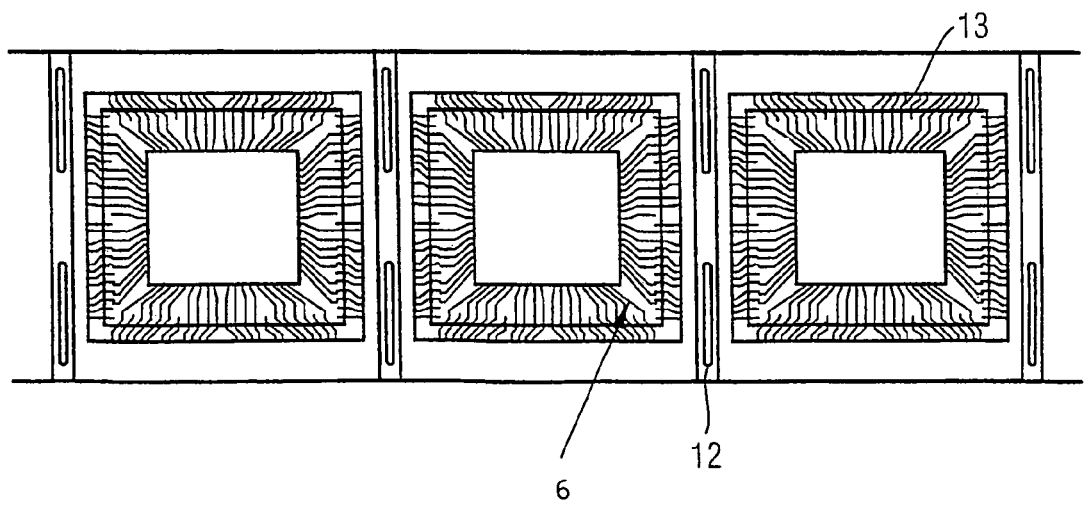
FIG. 2 is a plan view of a number of flex strips connected together for use in tape and reel format or strip format.

FIGS. 1 and 2 show a multi-die device 1 comprising two dies 2, 3, one die being mounted on top of the other, the top die 2 having a smaller surface area than the lower die 3. The pair of dies 2, 3 are mounted as a unit on a substrate 4. A plurality of flexible strips 6 are used to electrically connect the contacts 8 on the dies 2, 3 to each other (die-to-die) and the contacts 8 on the dies 2, 3 to the bond fingers 10 on the substrate 4. The flexible strips 6 may be formed of, for example, polyimide material.

The strips 6 may be manufactured in a variety of thicknesses depending upon the specifications of the bonding pitch. The length and width can be the same as the leadframe. The length and width of the polyimide strips are designed to be the same as the lead frame, having a conductive strip width of around between 0.75 to 1 µm.

FIG. 2 shows a number of the flex strips 6. The strips 6 may have a number of location holes 12 for ease of positioning the strip 6 relative to the substrate 4. The strips 6 may be manufactured in tape and reel format or in strip format to form templates for ease of manufacture and fast volume production. Each of the strips 6 contain, on the underside thereof, a number arrays of routing circuits 13 to match the dies 2, 3 and substrate 4 to which they are to be bonded. A number of solder-on pads (not shown) are located at the ends of the routing circuits 13.

Figure 3A:
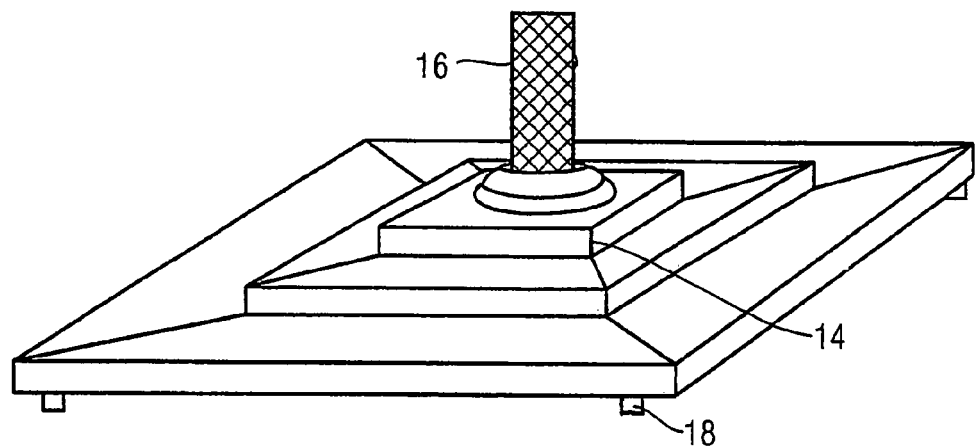
FIGS. 3a, 3b and 3c show side perspective views of the flex strip interconnection process according to an embodiment of the invention.
Figure 3B:
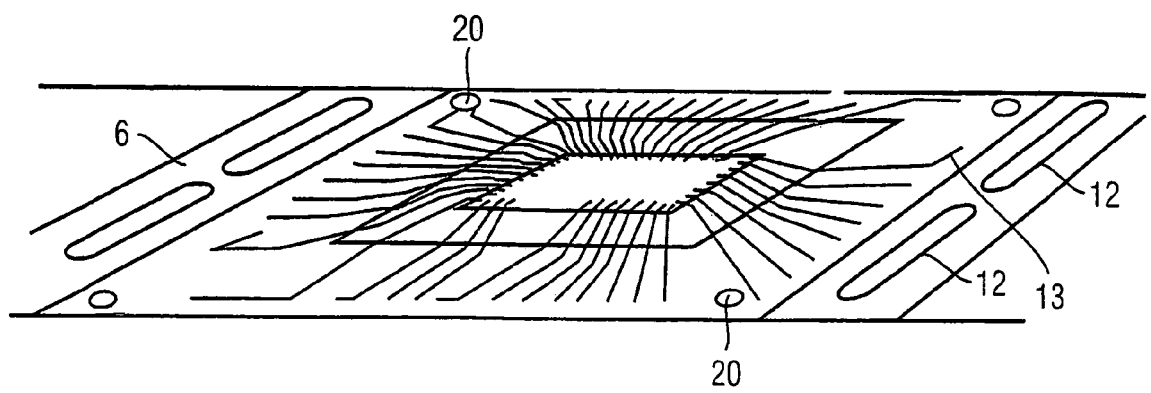
Figure 3C:
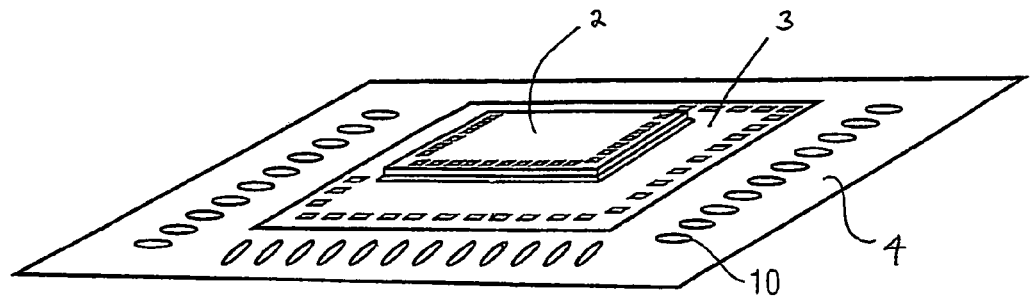

The process of interconnecting the strips 6 to the dies 2, 3 and the substrate 4 is shown in FIGS. 3a, 3b and 3c. As shown in FIG. 3a, an aluminum template 14 is connected (for example, permanently connected) to a holder 16. The holder 16 contains control and pre-heating circuitry (not shown). The aluminum template 14 is heated by the pre-heating circuitry in the holder 16. For example, the aluminum metal template 14 can be preheated to punch the flex strips 6 to be bonded onto the silicon-to-silicon and substrate 4. The underside of the aluminum template 14 has a number of guide pins 18 formed thereon. The guide pins 18 can hold the tape/reel for alignment with the die pad openings.

FIG. 3b shows a strip 6 from a tape/reel that is suitable for bonding onto the dies 2, 3 and onto the substrate 4. The strip 6 includes the array of routing circuits 13 and a plurality of location holes 12 for locating the strip 6 over the substrate 4 so that the array of routing circuits 13 is located over the substrate 4 and dies 2, 3. Punch holes 20 (4 nos) can be included for each unit.

FIG. 3c shows the substrate 4 with two dies 2, 3 stacked one upon the other and attached thereto ready to receive the flex strip 6 shown in FIG. 3b.

To assemble the device, the substrate 4 with the dies 2, 3 stacked thereon is positioned under the aluminum template 14. For example, the dies 2, 3 can be stacked upon each other and attached with glue.

The strip 6 is transported to the bonding area via conveyors and it is positioned between the template 14 and the substrate 4. The aluminum template 14 is preheated and brought down onto the strip 6 forcing the strip 6 into contact with the substrate 4 and dies 2, 3. The guide pins 18 on the template 14 are thereby also preheated and punch through the strip 6 causing punch holes 20 to be created. The guide pins 18 and punch holes 20 retain the strip 6 firmly in position over the substrate 4 such that the solder pads on the routing circuits 13 are pressed onto the bond pads of the dies 2, 3 and the bond fingers 10 on the substrate 4.

The bond between the solder pads and the bond pads and fingers is created by ultrasonic or heating techniques. The template 14 is then removed and the device is ready for encapsulation.

Figure 4:
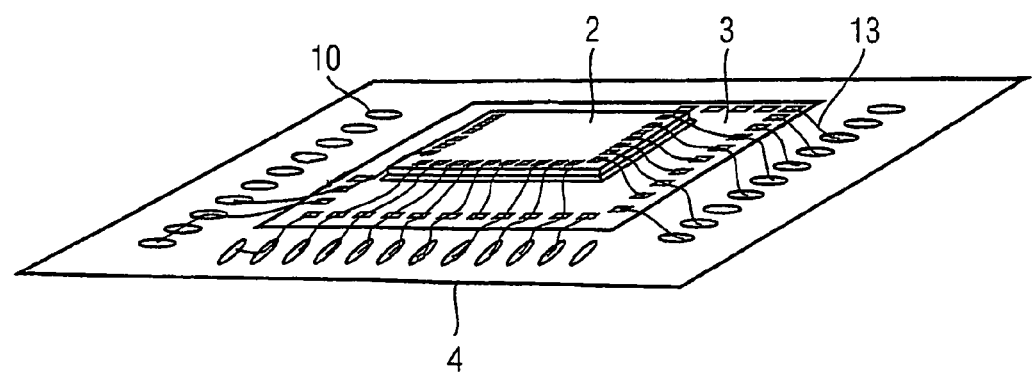
FIG. 4 is a perspective view of a multi-die device according to an embodiment of the invention after flex strip interconnection.

FIG. 4 shows the assembled device prior to encapsulation and comprising the substrate 4, which may have multiple layers, for example between two to four layers. The layers carry the stacked dies 2, 3 and the strip 6 connecting the bonding pads on the dies and the bond fingers 10 on the substrate 4.

Various modifications to the embodiments of the present invention described above may be made. For example, in a preferred embodiment, the substrate may comprise two or more layers. Also, the substrate may be formed, for example of bismaleimide-triazine (BT) resin. Therefore, although the invention has been described above using particular embodiments, many variations are possible within the scope of the claims, as will be clear to the skilled reader, without departing from the spirit and scope of the invention.

What is claimed is:

1. An apparatus for forming a device comprising a substrate, a die assembly attachable to the substrate, the die assembly comprising at least two dies, and a flexible strip extending over the substrate and the die assembly, the flexible strip having one or more routing circuits carried thereon, wherein the one or more routing circuits on the flexible strip electrically connect each die of the die assembly with each other die of the die assembly and/or with the substrate, the apparatus comprising a removable template to locate and retain the flexible strip over the substrate and the die assembly during establishment of electrical contact being created between the die assembly and the substrate through the flexible strip.

2. The apparatus according to claim 1, further comprising one or more pins protruding from the template, wherein the one or more pins extend through one or more guide holes in the flexible strip to retain the flexible strip in position.

3. The apparatus according to claim 1, wherein the template comprises metal.

4. A semiconductor device, the device comprising:
a substrate having substrate contacts on a top surface of a first area;
a first die having first bonding pads on a top surface of a second area disposed over the substrate, the second area being smaller than the first area;
a second die having second bonding pads on a top surface of a third area disposed over the first die, the third area being smaller than the first area; and
first routing circuits disposed within a flexible strip coupling the first bonding pads with the substrate contacts, wherein an outer perimeter of the flexible strip is less than a perimeter of the substrate, but greater than a perimeter of the first die; and
second routing circuits disposed within the flexible strip, the second routing circuits having first ends and opposite second ends, wherein the first ends contact the first bonding pads, wherein the second ends contact the second bonding pads.

5. The device according to claim 4, wherein the first ends and the second ends of the second routing circuits comprise solder pads.

6. The device according to claim 4, wherein the flexible strip, the first and the second dies are arranged about symmetrically over the substrate.

7. The device according to claim 4, wherein the flexible strip comprises polyimide material.

8. The device according to claim 4, wherein the flexible strip comprises a locating aperture.

9. The device according to claim 4, wherein the third area is smaller than the second area.

\* \* \* \* \*